(12) United States Patent
Kawai et al.

(10) Patent No.: US 6,842,395 B2
(45) Date of Patent: Jan. 11, 2005

(54) SEMICONDUCTOR MEMORY CARD, METHOD OF CONTROLLING THE SAME AND INTERFACE APPARATUS FOR SEMICONDUCTOR MEMORY CARD

(75) Inventors: Hideki Kawai, Nara (JP); Yutaka Nakamura, Kyoto (JP); Tomoaki Izumi, Neyagawa (JP)

(73) Assignee: Matsushira Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/288,636

(22) Filed: Nov. 5, 2002

(65) Prior Publication Data
US 2003/0090953 A1 May 15, 2003

(30) Foreign Application Priority Data
Nov. 5, 2001 (JP) ........................... 2001-339201

(51) Int. Cl.$^7$ ................................ G11C 8/00
(52) U.S. Cl. ................... 365/233; 365/194; 365/189.05
(58) Field of Search ................. 365/233, 194, 365/189.03, 233.5

(56) References Cited

U.S. PATENT DOCUMENTS 6,515,938 B2 * 2/2003 Tsuruto et al. ............. 365/233

FOREIGN PATENT DOCUMENTS

| JP | 07271926 A | 10/1995 |
| JP | 09212599 A | 8/1997 |

* cited by examiner

Primary Examiner—David Lam
(74) Attorney, Agent, or Firm—Akin Gump Strauss Hauer & Feld, L.L.P.

(57) ABSTRACT

A semiconductor memory card is provided that includes: a data storing part; a control part writing and reading data into and from the data storing part; an interface circuit; and a plurality of input and output terminals, wherein data input and output terminal pairs are each allotted to a different terminal pair so that no terminal pair acts as both the data input terminal pair and the data output terminal pair, and a clock input terminal and a clock output terminal are included. The interface circuit receives an input clock from the clock input terminal, receives a complementary input data pair synchronized with the input clock from the data input terminal pair, outputs a complementary output data pair from the data output terminal pair, and outputs an output clock synchronized with the complementary output data pair from the clock output terminal.

12 Claims, 13 Drawing Sheets

| | FIRST OPERATION MODE | | SECOND OPERATION MODE | | THIRD OPERATION MODE | |
|---|---|---|---|---|---|---|
| | ATTRIBUTE | FUNCTION | ATTRIBUTE | FUNCTION | ATTRIBUTE | FUNCTION |
| TERMINAL 1 | INPUT AND OUTPUT | DATA INPUT AND OUTPUT(3) | INPUT | CHIP SELECT INPUT | INPUT | CLOCK INPUT |
| TERMINAL 2 | INPUT AND OUTPUT | COMMAND INPUT AND RESPONSE OUTPUT | INPUT | DATA INPUT | INPUT | DATA INPUT (+) |
| TERMINAL 3 | POWER SUPPLY | GROUND POTENTIAL | POWER SUPPLY | GROUND POTENTIAL | POWER SUPPLY | GROUND POTENTIAL |
| TERMINAL 4 | POWER SUPPLY | POWER SUPPLY POTENTIAL | POWER SUPPLY | POWER SUPPLY POTENTIAL | POWER SUPPLY | POWER SUPPLY POTENTIAL |
| TERMINAL 5 | INPUT | CLOCK INPUT | INPUT | CLOCK INPUT | OUTPUT | CLOCK OUTPUT |
| TERMINAL 6 | POWER SUPPLY | GROUND POTENTIAL | POWER SUPPLY | GROUND POTENTIAL | POWER SUPPLY | GROUND POTENTIAL |
| TERMINAL 7 | INPUT AND OUTPUT | DATA INPUT AND OUTPUT(0) | OUTPUT | DATA OUTPUT | OUTPUT | DATA OUTPUT (+) |
| TERMINAL 8 | INPUT AND OUTPUT | DATA INPUT AND OUTPUT(1) | HIGH IMPEDANCE | UNUSED | OUTPUT | DATA OUTPUT (−) |
| TERMINAL 9 | INPUT AND OUTPUT | DATA INPUT AND OUTPUT(2) | HIGH IMPEDANCE | UNUSED | INPUT | DATA INPUT (−) |

| | FIRST OPERATION MODE | | SECOND OPERATION MODE | |
|---|---|---|---|---|
| | ATTRIBUTE | FUNCTION | ATTRIBUTE | FUNCTION |
| TERMINAL 1 | INPUT AND OUTPUT | DATA INPUT AND OUTPUT(3) | INPUT | CHIP SELECT INPUT |
| TERMINAL 2 | INPUT AND OUTPUT | COMMAND INPUT AND RESPONSE OUTPUT | INPUT | DATA INPUT |
| TERMINAL 3 | POWER SUPPLY | GROUND POTENTIAL | POWER SUPPLY | GROUND POTENTIAL |
| TERMINAL 4 | POWER SUPPLY | POWER SUPPLY POTENTIAL | POWER SUPPLY | POWER SUPPLY POTENTIAL |
| TERMINAL 5 | INPUT | CLOCK INPUT | INPUT | CLOCK INPUT |
| TERMINAL 6 | POWER SUPPLY | GROUND POTENTIAL | POWER SUPPLY | GROUND POTENTIAL |
| TERMINAL 7 | INPUT AND OUTPUT | DATA INPUT AND OUTPUT(0) | OUTPUT | DATA OUTPUT |
| TERMINAL 8 | INPUT AND OUTPUT | DATA INPUT AND OUTPUT(1) | HIGH IMPEDANCE | UNUSED |
| TERMINAL 9 | INPUT AND OUTPUT | DATA INPUT AND OUTPUT(2) | HIGH IMPEDANCE | UNUSED |

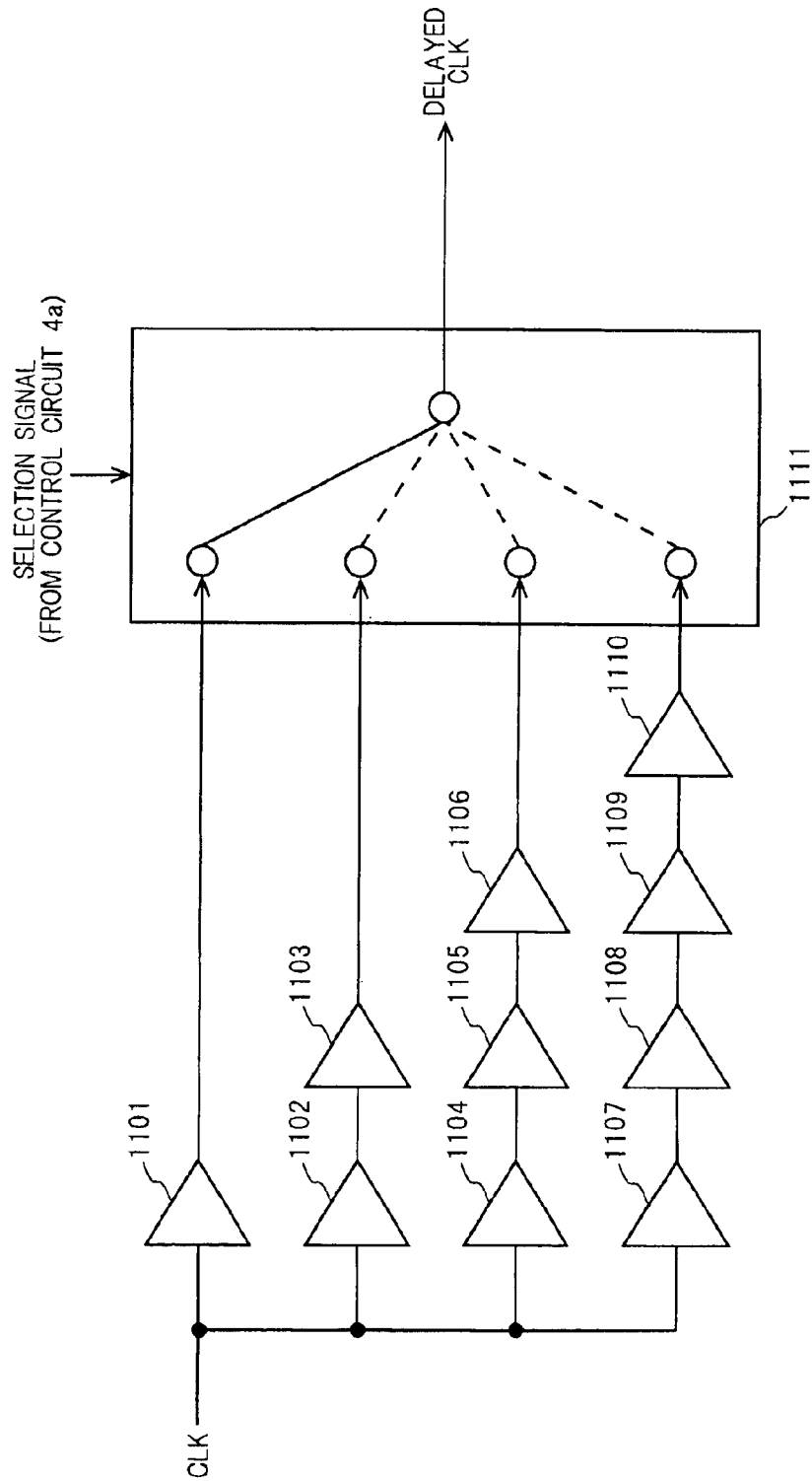
F I G. 1 1

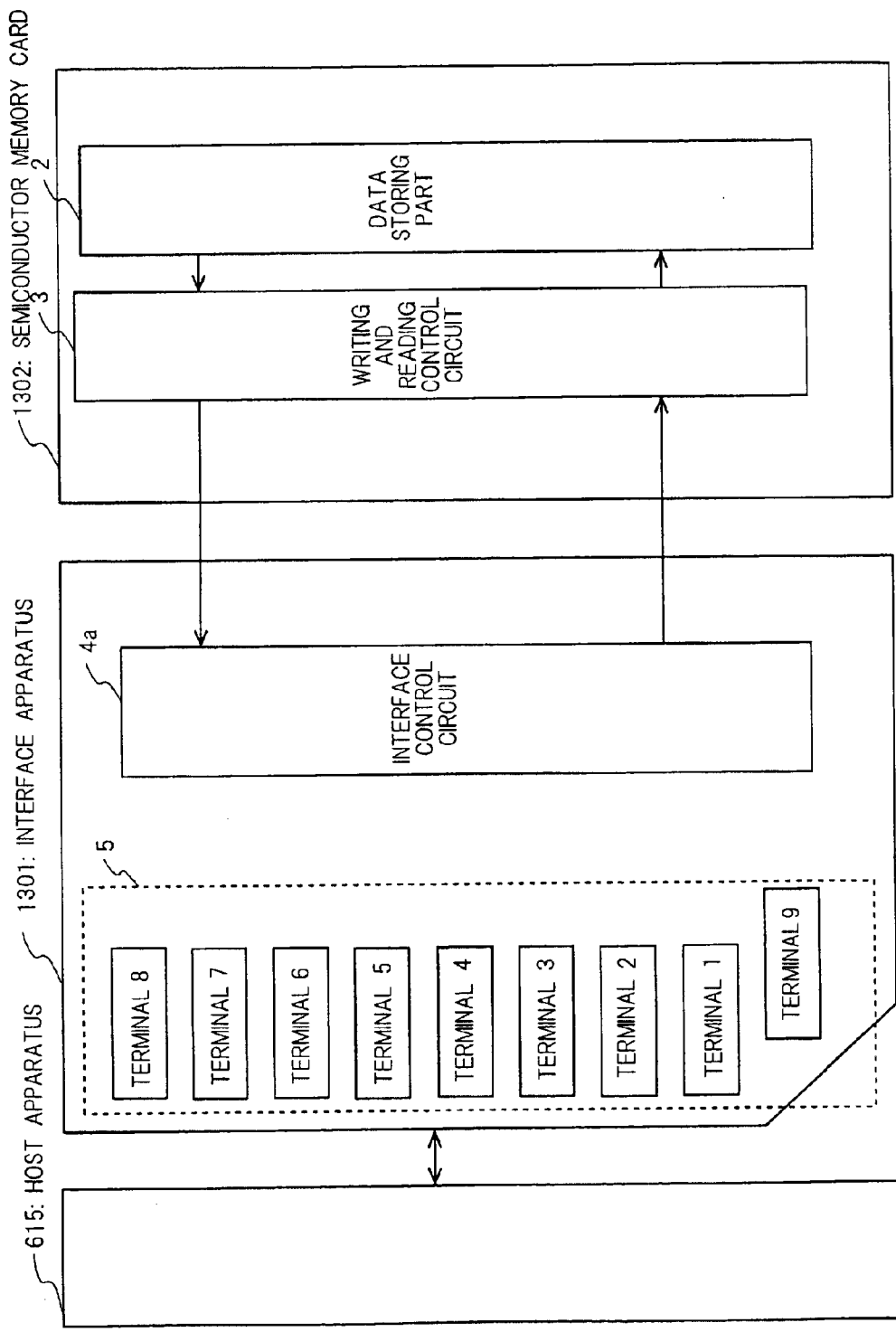

SEMICONDUCTOR MEMORY CARD, METHOD OF CONTROLLING THE SAME AND INTERFACE APPARATUS FOR SEMICONDUCTOR MEMORY CARD

BACKGROUND OF THE INVENTION

The present invention relates to a semiconductor memory card, a method of controlling the semiconductor memory card and an interface apparatus for semiconductor memory card.

Semiconductor memory cards with a minimized number of terminals and interface standards for the semiconductor memory cards have been proposed for size reduction of semiconductor memory cards and host apparatuses of the semiconductor memory cards. A prior art semiconductor memory card will be described with reference to FIG. 8 and FIG. 9. FIG. 8 is a block diagram of the already proposed prior art semiconductor memory card (including an internal block diagram of an interface circuit of the semiconductor memory card). In FIG. 8, the semiconductor memory card 801 comprises: a data storing part 802 including a flash memory, a DRAM, an SRAM and the like for storing data; a control circuit 803 writing and reading data into and from the data storing part 802; an interface circuit 804 performing data input and output with the host apparatus; and a connection terminal 805.

As an example of the semiconductor memory card 801, one prior art semiconductor memory card has been proposed that supports two kinds of interface standards as shown in FIG. 9 in order that the semiconductor memory card is adaptable to diversification of interface specifications of host apparatuses. FIG. 9 shows the attributes and the functions allotted to nine terminals of the prior art semiconductor memory card supporting the two kinds of interface standards when the semiconductor memory card operates according to the two interface standards (a first operation mode and a second operation mode). A first terminal structure (first operation mode) and a second terminal structure (second operation mode) are as shown in FIG. 9. Of the structures based on the specifications of the two kinds of operation modes shown in FIG. 9, the structure based on the interface specification of the second operation mode is shown in FIG. 8.

In the structure of FIG. 8, the attribute of a terminal 1 of the connection terminal 805 is "input", and the function allotted thereto is "chip select input". The terminal 1 inputs a command signal CS to the control circuit 806 through a buffer 810. The attribute of a terminal 2 is "input", and the function allotted thereto is "data input". The terminal 2 inputs input data DI to the control circuit 806 through a data input buffer 807. The attribute of a terminal 5 is "input", and the function allotted thereto is "clock input". The terminal 5 inputs a clock signal CLK to the control circuit 806 through a buffer 809. The attribute of a terminal 7 is "output", and the function allotted thereto is "data output". Output data DO is output from the terminal 7 through a data output buffer 808. The attributes of terminals 3, 4 and 6 are "power supply", and the functions allotted to the terminals 3, 4 and 6 are "connection to the ground potential", "connection to the power supply potential" and "connection to the ground potential", respectively. The attributes of terminals 8 and 9 are "high impedance", and the terminals 8 and 9 are unused.

In the prior art semiconductor memory card 801, the functions according to the second operation mode are allotted to the terminals as described above. The semiconductor memory card 801 in the second operation mode performs data writing and reading with a host apparatus of the interface specification of the second operation mode. FIG. 8 does not show the connection structure of the interface circuit 804 in the first operation mode. In the first operation mode, the interface circuit 804 of the semiconductor memory card is structured based on the specification shown in FIG. 9. The semiconductor memory card in the first operation mode performs data writing and reading with a host apparatus of the interface specification of the first operation mode.

In the prior art semiconductor memory card, when data is transmitted, in the first operation mode, both "input" and "output" are allotted to one terminal (line), so that when data is transmitted in two directions at the same time, data collision occurs on one line. For this reason, high-speed data communication control of executing data transmission in two directions at the same time cannot be performed. The prior art semiconductor memory card uses the input clock input to the terminal 5 as it is as the clock for data output. Therefore, when the clock frequency is high, a timing shift between the data and the clock is caused on the receiving side (the host apparatus connected to the semiconductor memory card). Moreover, in the second operation mode, because of the presence of the unused terminals (lines), it cannot be said that terminals are efficiently used.

The present invention is made with an object of providing a semiconductor memory card enabling high-speed data communication control and being capable of eliminating a timing shift between the output data and the output clock on the receiving side (the host apparatus connected to the semiconductor memory card), a method of controlling the semiconductor memory card and an interface apparatus for semiconductor memory card.

BRIEF SUMMARY OF THE INVENTION

To achieve this object, a semiconductor memory card according to an aspect of the invention comprises: a data storing part; a writing and reading control part writing and reading data into and from the data storing part; an interface circuit; and a plurality of input and output terminals. In the input and output terminals, roles of a data input terminal pair and a data output terminal pair are each allotted to a different terminal pair so that no terminal pair acts as both the data input terminal pair and the data output terminal pair, and a clock input terminal and a clock output terminal are included. The interface circuit receives an input clock from the clock input terminal, receives a complementary input data pair synchronized with the input clock from the data input terminal pair, outputs a complementary output data pair from the data output terminal pair, and outputs an output clock synchronized with the complementary output data pair from the clock output terminal.

According to the present invention, input data and output data never collide with each other on the data line, so that high-speed data communication control is enabled. Moreover, since the transmission data is differential data (complementary data pair), the S/N ratio of the transmission data is improved, so that high-speed sensing is enabled on the receiving side. At the same time, by the data amplitude being small on the output side, the clock frequency can be increased without the slew rate in the output stage being changed. According to the present invention, an input clock and an output clock having different phases are synchronized with input data and output data, respectively. The present invention realizes a semiconductor memory card in which a timing shift between the clock and the data due to a delay on the transmission line is eliminated.

The semiconductor memory card according to another aspect of the invention performs data input and output with a host apparatus. The interface circuit receives an input clock output by the host apparatus and input data synchronized with the input clock. The interface circuit generates the output clock having a phase different from a phase of the input clock and being synchronized with the complementary output data pair by adjusting a timing of the input clock, outputs the output clock from the clock output terminal, and outputs the complementary output data pair from the data output terminal pair.

The present invention realizes a semiconductor memory card requiring no clock generating part.

A semiconductor memory card according to another aspect of the invention comprises: an interface circuit setting an attribute and a function of each of a plurality of input and output terminals and performing internal setting in accordance with an operation mode selected and set from among a plurality of operation modes including a high-speed operation mode; and the plurality of input and output terminals. In the high-speed operation mode, the plurality of input and output terminals comprise: a clock input terminal to which an input clock is input; a clock output terminal from which an output clock is output; a data input terminal pair to which a complementary input data pair synchronized with the input clock is input; and a data output terminal pair from which a complementary output data pair is output. The interface circuit comprises the following as elements operating at least in the high-speed operation mode: a switch capable of being switched in accordance with the high-speed operation mode; a differential input buffer receiving the complementary input data pair, sensing a difference between the complementary input data pair by the input clock, and latching the difference; a differential output buffer receiving output data and outputting the output data by the input clock as the complementary output data pair; and a timing adjusting circuit receiving the input clock, adjusting a timing of the input clock with the complementary output data pair, and outputting, as the output clock, the input clock timing-adjusted so as to be synchronized with the complementary output data pair.

The present invention realizes a semiconductor memory card adaptable to the interface specifications of a plurality of operation modes, and particularly, are adaptable to the high-speed operation mode without the number of connection terminals being increased.

In the semiconductor memory card according to still another aspect of the invention, the interface circuit has output impedance adjusting circuit(s) each of between the data output terminal pair and the differential output buffer and between the output clock terminal and the timing adjusting circuit.

The present invention realizes a semiconductor memory card in which impedance matching with the signal line is obtained.

In the semiconductor memory card according to still another aspect of the invention, the interface circuit further comprises a band pass filter receiving the input clock and allowing only a predetermined frequency band component to pass through the band pass filter. The present invention realizes a semiconductor memory card in which a clock with a small amount of ringing component and a high S/N ratio is extracted by capturing only the predetermined frequency band component.

In the semiconductor memory card according to still another aspect of the invention, a passband frequency of the band pass filter is selectable.

The present invention realizes a semiconductor memory card in which a timing shift due to a reflected wave is prevented by capturing a clock of a predetermined frequency band with reliability and changing the frequency setting.

A semiconductor memory card controlling method according to still another aspect of the invention is a method of controlling, in a high-speed operation mode, a semiconductor memory card having a plurality of input and output terminals and performing data input and output with a host apparatus in a plurality of operation modes including a normal operation mode and the high-speed operation mode. The method comprises the steps of: setting the high-speed operation mode in response to a setting command of the high-speed operation mode from the host apparatus; switching an operation of the semiconductor memory card so that data transmission and reception can be performed in the high-speed operation mode; allotting roles of a data input terminal pair, a data output terminal pair, a clock input terminal and a clock output terminal separately to the input and output terminals so that none of the input and output terminals has a plurality of roles; inputting an input clock from the clock input terminal and inputting a complementary input data pair synchronized with the input clock from the data input terminal pair; generating an output clock having a phase different from a phase of the input clock, by adjusting a timing of the input clock; and outputting the output clock from the clock output terminal and outputting a complementary output data pair synchronized with the output clock from the data output terminal pair.

A slave apparatus according to still another aspect of the invention is a slave apparatus performing synchronous data transmission according to a master/slave method with a host apparatus as a master and a slave apparatus as a slave. The slave apparatus comprises: an input part inputting a clock and data output by the host apparatus in synchronism with each other; and an output part outputting to the host apparatus the clock being input or a clock obtained by timing-adjusting the clock, and data in synchronism with each other.

In the slave apparatus according to still another aspect of the invention, the slave apparatus is a semiconductor memory card.

The present invention realizes a slave apparatus (e.g. semiconductor memory card) performing high-data-rate and stable data transmission according to a master/slave method under a condition where the master apparatus (host apparatus) maintains a function to appropriately control the entire communication.

An interface apparatus for a semiconductor memory card according to still another aspect of the invention is an interface apparatus for a semiconductor memory card comprising: an interface circuit setting an attribute and a function of each of a plurality of input and output terminals and performing internal setting in accordance with an operation mode selected and set from among a plurality of operation modes including a high-speed operation mode; and the plurality of input and output terminals. In the high-speed operation mode, the plurality of input and output terminals comprise: a clock input terminal to which an input clock is input; a clock output terminal from which an output clock is output; a data input terminal pair to which a complementary input data pair synchronized with the input clock is input; and a data output terminal pair from which a complementary output data pair is output. The interface circuit comprises the following as elements operating at least in the high-speed operation mode: a switch capable of being switched in accordance with the high-speed operation mode; a differential input buffer receiving the complementary input data pair, sensing a difference between the complementary input data pair by the input clock, and latching the difference; a differential output buffer receiving output data and outputting the output data by the input clock as the complementary output data pair; and a timing adjusting circuit receiving the input clock, adjusting a timing of the input clock with the complementary output data pair, and outputting, as the output clock, the input clock timing-adjusted so as to be synchronized with the complementary output data pair.

The present invention realizes an interface apparatus for a semiconductor memory card adaptable to the interface specifications of a plurality of operation modes, and particularly, are adaptable to the high-speed operation mode without the number of connection terminals being increased.

The novel features of the invention are set forth with particularity in the appended claims. The invention, both as to the construction and contents, together with further objects and features will be better understood and appreciated from the following detailed description taken in conjunction with the accompanying drawings.

BRIEF DESCRIPTION OF THE DRAWINGS

FIG. 5 is an explanatory view showing the attributes and the functions of the terminals of a semiconductor memory card according to a second embodiment of the present invention in each operation mode;

FIG. 9 is an explanatory view showing the attributes and the functions of the terminals of the prior art semiconductor memory card in each operation mode;

FIG. 11 is a block diagram showing the structure of a timing adjusting circuit according to another embodiment of the present invention.

FIG. 13 is a block diagram of a system comprising: a host apparatus 615, an interface apparatus 1301 according to the third embodiment of the present embodiment and a semiconductor memory card 1302 according to the third embodiment of the present embodiment.

It will be recognized that some or all of the Figures are schematic representations for purposes of illustration and do not necessarily depict the actual relative sizes or locations of the elements shown.

DETAILED DESCRIPTION OF THE INVENTION

Hereinafter, embodiments of the semiconductor memory card, a method of controlling the semiconductor memory card and an interface apparatus for semiconductor memory card according to the present invention will be described in detail with reference to the drawings.

<<Embodiment 1>>

Figure 1:
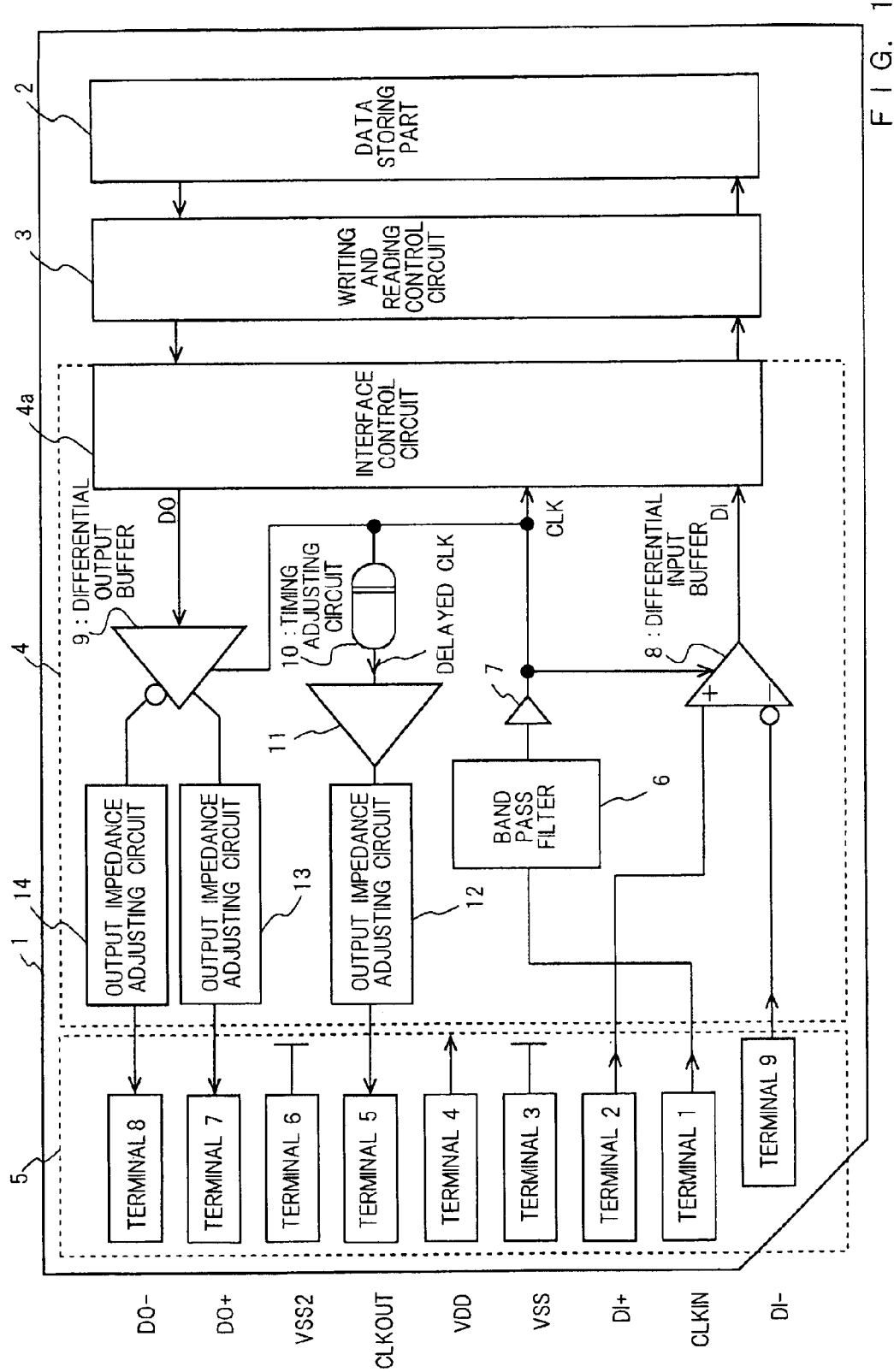
FIG. 1 is a block diagram of a semiconductor memory card according to a first embodiment of the present invention (including an internal block diagram of an interface circuit of the semiconductor memory card)
Figure 2:
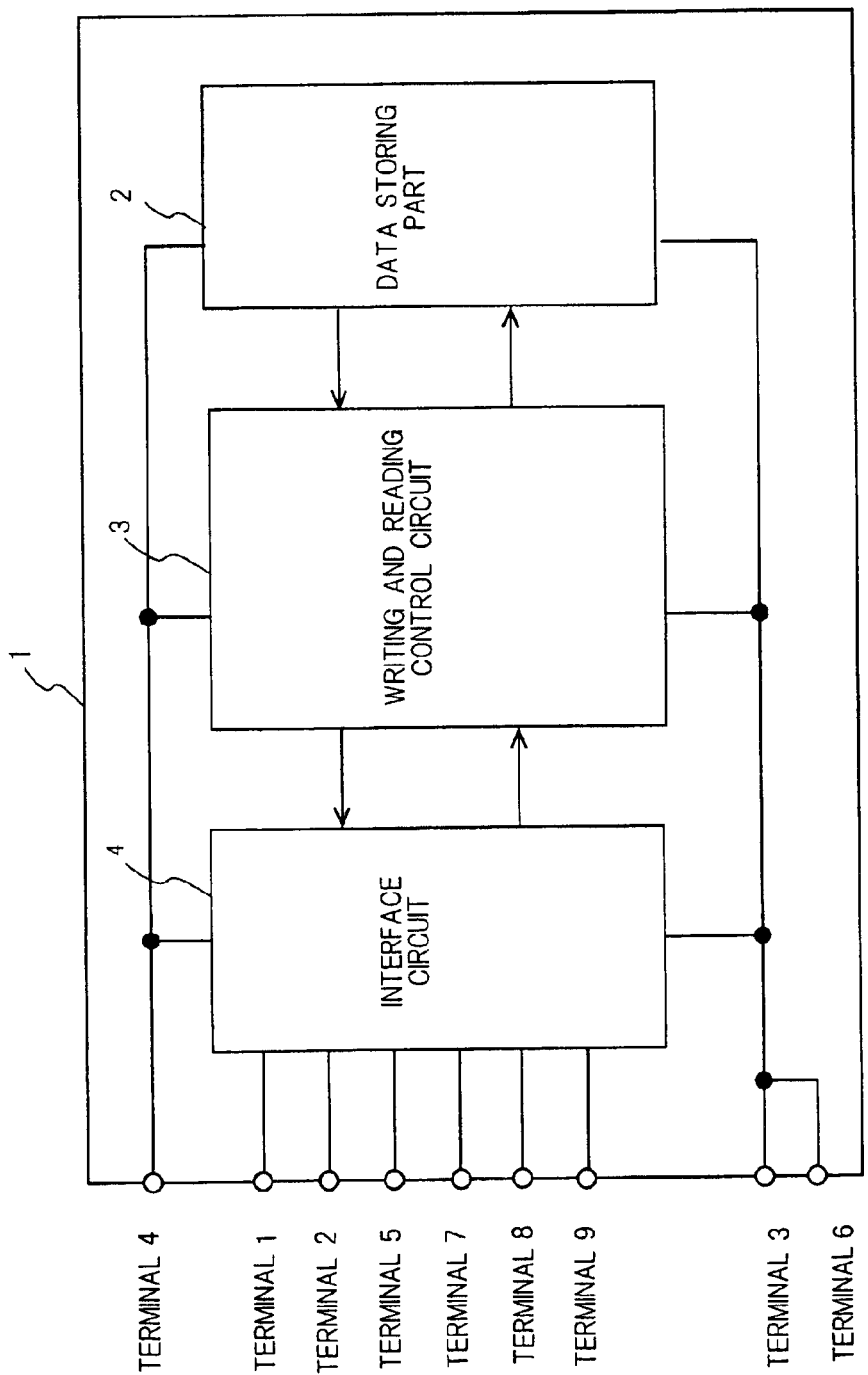
FIG. 2 is a general block diagram detailing the power supply line of the semiconductor memory card according to the first embodiment of the present invention.
Figure 3:
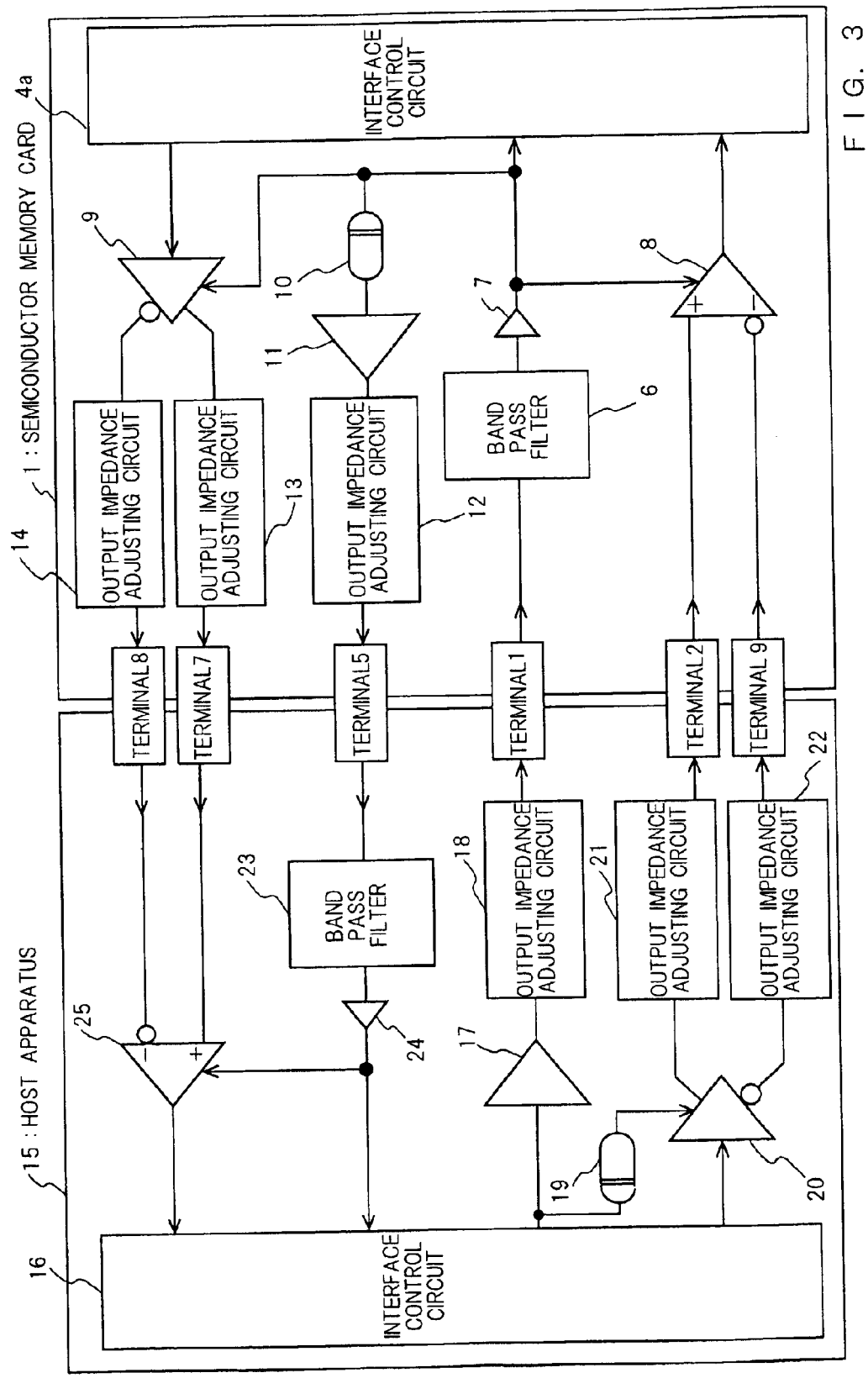
FIG. 3 is a block diagram showing a connection relationship between the semiconductor memory card and a host apparatus according to the first embodiment of the present invention.
Figure 4:
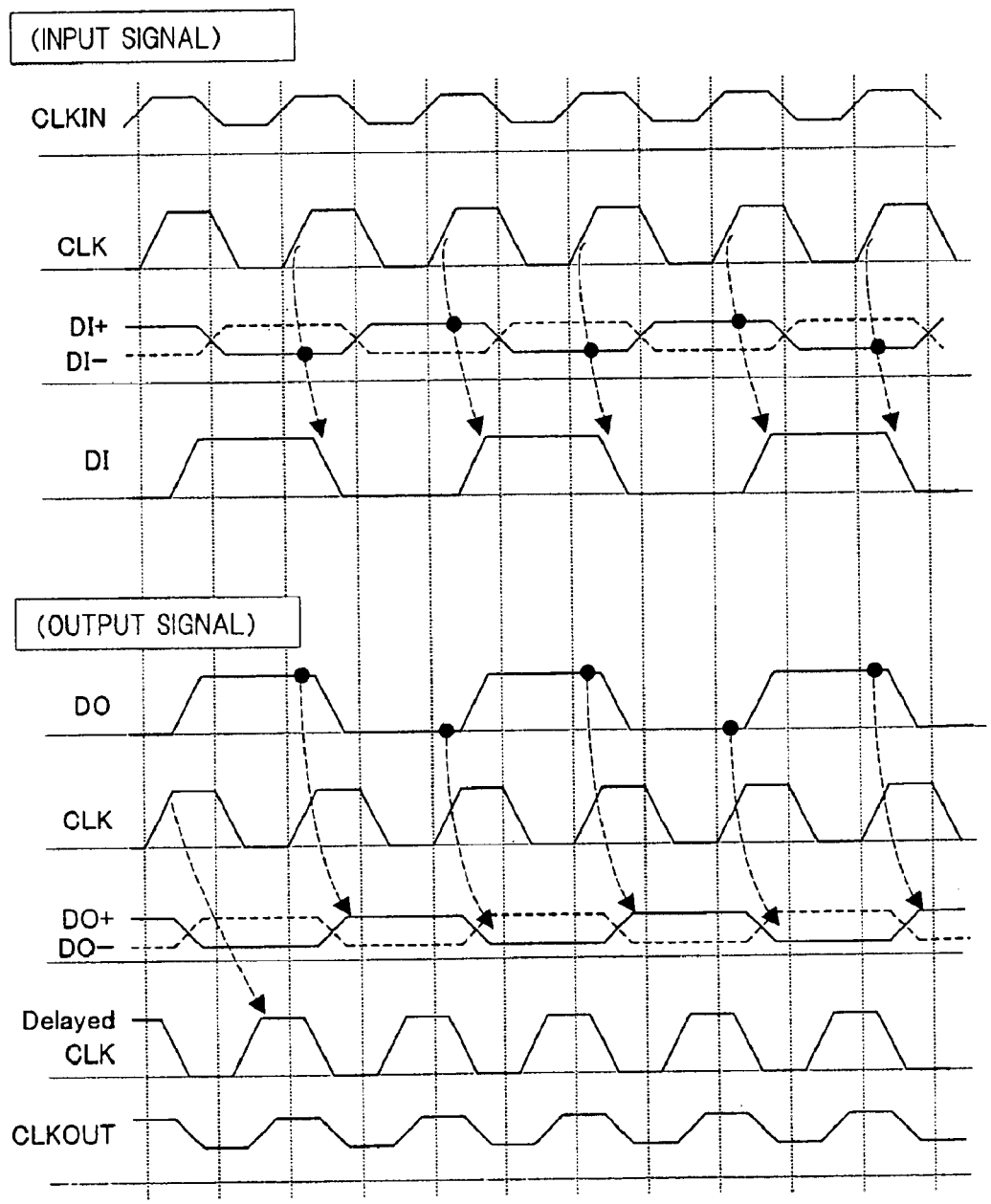
FIG. 4 is a view showing the waveforms of input and output signals of the semiconductor memory card 1 according to the first embodiment of the present invention, and the timing among the signals.

A semiconductor memory card 1 and a host apparatus 15 according to a first embodiment of the present invention will be described with reference to FIG. 1 to FIG. 4, FIG. 10 and FIG. 11. FIG. 1 is a block diagram of the semiconductor memory card 1 according to the first embodiment of the present invention (including an internal block diagram of an interface circuit of the semiconductor memory card). FIG. 2 is a general block diagram detailing the power supply line of the semiconductor memory card 1 according to the first embodiment. FIG. 3 is a block diagram showing the connection relationship between the semiconductor memory card 1 and the host apparatus 15 according to the first embodiment. FIG. 4 is a timing chart showing the waveforms of signals of the semiconductor memory card 1 according to the first embodiment.

In FIG. 1 to FIG. 4, the semiconductor memory card 1 comprises: a data storing part 2 including a flash memory, a DRAM and/or an SRAM for storing data; a writing and reading control circuit 3 writing and reading data into and from the data storing part 2; an interface circuit 4 performing data input and output with the host apparatus 15; and a connection terminal 5. The data storing part 2 typically includes a nonvolatile memory such as a flash memory. The interface circuit 4 comprises: an interface control circuit 4a performing input and output control on the writing and reading control circuit 3; and an input and output circuit described later and disposed between the interface control circuit 4a and the connection terminal 5.

The connection terminal 5 comprises nine terminals 1 to 9. In the first embodiment, to the terminal 1, an input clock CLKIN is input, to the terminal 2, a non-inverted signal DI+ (one of a complementary data pair) of differential input data, to the terminal 3, a first ground potential VSS is connected, to the terminal 4, a power supply potential VDD is connected, from the terminal 5, an output clock CLKOUT is output, to the terminal 6, a first ground potential VSS2 is connected, from the terminal 7, a non-inverted signal DO+ (one of a complementary output data pair) of differential output data is output, from the terminal 8, an inverted output DO− (the other of the complementary output data pair) of the differential output data is output, and to the terminal 9, an inverted signal DI− of the differential input data is input. The terminals 2 and 9 constitute a data input terminal pair to which the complementary input data pair is input. The terminals 7 and 8 constitute a data output terminal pair from which the complementary output data pair is output.

The connection condition of the terminals in the entire semiconductor memory card 1 is shown in FIG. 2. As shown in FIG. 2, the terminals 4, 3 and 6 serving as power supply terminals are connected to the circuit blocks of the data storing part 2, the writing and reading control circuit 3 and the interface circuit 4. The other terminals are connected only to the interface circuit 4.

The input clock CLKIN input to the terminal 1 is input as a clock CLK to the interface control circuit 4a and differential input buffers 8 and 9 through a band pass filter 6 and an input buffer 7. The band pass filter 6 allows only frequencies in the neighborhood of the fundamental frequency of the input clock CLKIN to pass therethrough. The band pass filter 6 attenuates the ringing component of the input clock CLKIN and improves the S/N ratio of the input clock having passed through the band pass filter. When the frequency of the input clock CLKIN is changed, the passband of the band pass filter 6 may be changed in accordance with a selection signal output by the interface control circuit 4a.

The differential input data DI+ and DI− input to the terminals 2 and 9 are input to the differential input buffer 8. The differential input buffer 8 senses, latches and outputs the input data DI which is the difference between the differential input data DI+ and DI− on the rising edge of the clock CLK output by the input buffer 7. The interface control circuit 4a latches and receives the input data DI on the falling edge (or the rising edge) of the clock CLK.

The interface circuit 4a outputs the output data DO on the falling edge (or the rising edge) of the clock CLK. The differential output buffer 9 receives the output data DO, latches the output data DO on the rising edge of the clock CLK, and outputs the differential output data DO+ and DO−. The differential output data DO+ and DO− are output from the terminals 7 and 8 through output impedance adjusting circuits 13 and 14, respectively.

A timing adjusting circuit 10 receives the clock CLK, delays the clock CLK (adjusts the timing of the clock CLK) so that the relative phases of the data and the clock are optimum on the receiving side to thereby synchronize the clock CLK with the complementary output data pair, and outputs a timing-adjusted clock signal Delayed CLK. The timing-adjusted clock signal Delayed CLK is output, as an output clock CLKOUT, from the terminal 5 through an output buffer 11 and an output impedance adjusting circuit 12.

The clock CLK input through the band pass filter 6 and the input buffer 7 is supplied to the differential input buffer 8. The differential input buffer 8 senses the differential input data DI+ and DO− and at the same time, lathes the input data DI which is the difference therebetween. The clock CLK is supplied to the differential output buffer 9. The differential output buffer 9 latches, on the rising edge of the clock CLK, the output data DO output from the interface control circuit 4a, and outputs the differential output data DO+ and DO− (the complementary output data pair of the output data DO). The output impedance adjusting circuits 12, 13 and 14 are provided for obtaining matching with the signal lines. The output impedance adjusting circuits 12, 13 and 14 are, for example, low-impedance resistors or bead filters. The output impedance adjusting circuits 12, 13 and 14 suppress the ringing components of the output clock CLKOUT and the differential output data DO+ and DO−.

Figure 10:
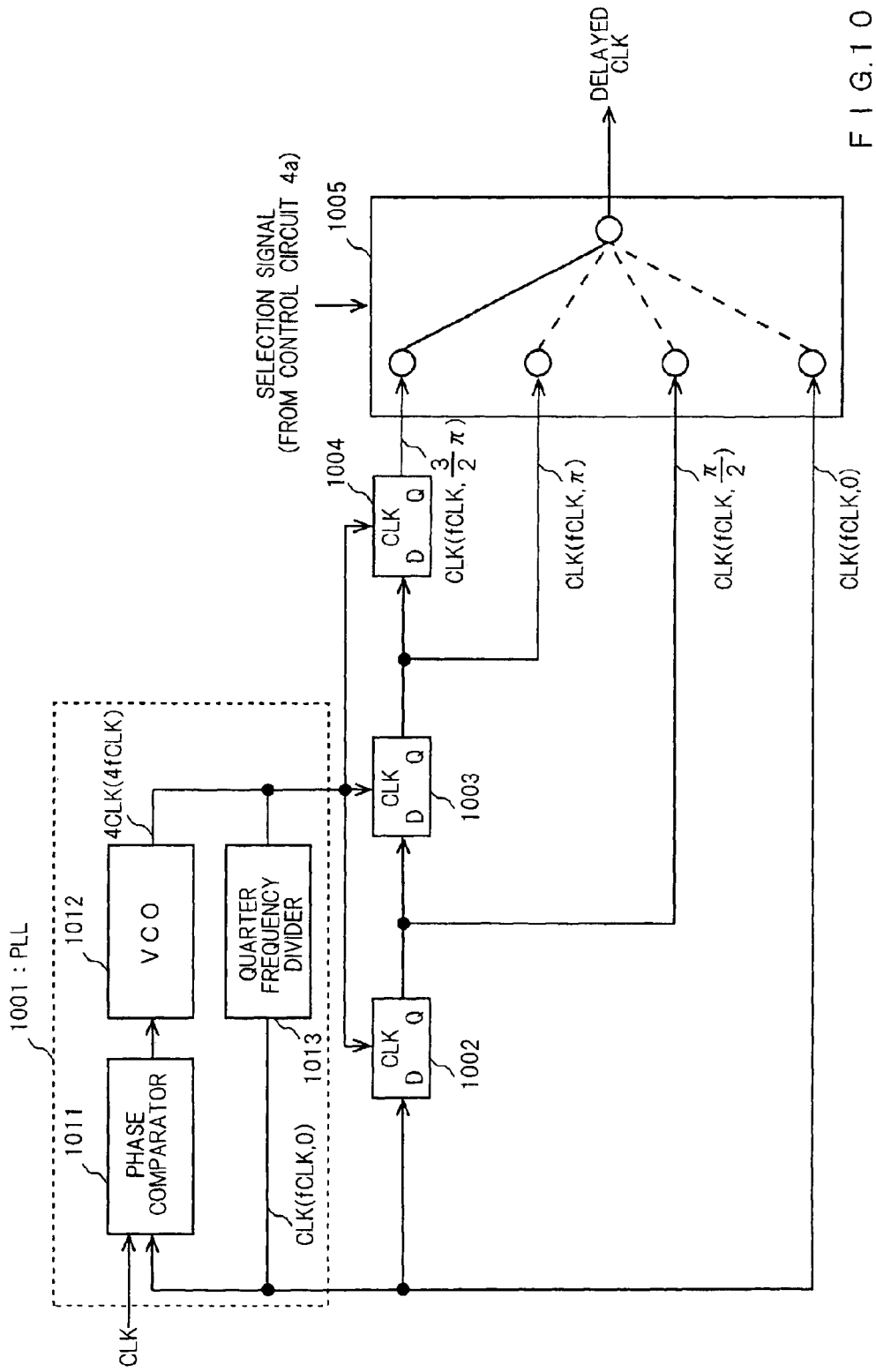
FIG. 10 is a block diagram showing the structure of a timing adjusting circuit 10 according to the first embodiment of the present invention.

FIG. 10 is a block diagram showing the structure of the timing adjusting circuit 10 according to the first embodiment. In FIG. 10, a phase comparator 1011, a voltage controlled oscillator 1012 and a quarter frequency divider 1013 constitute a phase-locked loop 1001. The phase-locked loop 1001 outputs a signal CLK (fCLK, 0) phase-synchronized with the clock CLK (frequency fCLK) and having the same frequency fCLK, and a signal 4CLK (4fCLK) having a frequency 4fCLK four times the frequency fCLK. D latch circuits 1002 to 1004 receive the signal 4CLK (4fCLK) as a latch clock. The D latch circuits 1002 to 1004 successively delay the signal CLK (fCLK, 0), and output a signal CLK (fCLK,π/2) phase-delayed by π/2 from the clock CLK, a signal CLK (fCLK,π) phase-delayed by π from the clock CLK and a signal CLK (fCLK,3π/2) phase-delayed by 3π/2 from the clock CLK, respectively. A switch 1005 selects one of the signal CLK (fCLK, 0), the signal CLK (fCLK,π/2), the signal CLK (fCLK,π) and the signal CLK (fCLK,3π/2) in accordance with a selection signal output by a control circuit 5a, and outputs the selected signal as the signal Delayed CLK. The control circuit 5a outputs, in accordance with the clock frequency, the selection signal to synchronize the clock and the data with each other so that the relative phases of the data and the clock are optimum on the receiving side.

FIG. 11 is a block diagram showing the structure of the timing adjusting circuit 10 according to another embodiment. In FIG. 11, reference numerals 1101 to 1110 represent buffers. The clock CLK is transmitted on four paths. A different number of buffers are disposed on each line. The larger the number of buffers is, the more the clock CLK is delayed. A switch 1111 selects one of the clocks CLK having passed through the four paths in accordance with the selection signal output by the control circuit 5a, and outputs the selected signal as the signal Delayed CLK.

When the frequency of the clock CLK is constant, the switching circuits (the switches 1005, 1111, etc.) of FIG. 10 and FIG. 11 may be omitted.

As described above, by separating the transmission line for input data and the transmission line for output data, when input data and output data are transmitted or received at the same time, the input data and the output data never collide with each other. High-speed communication control of transmitting or receiving input data and output data at the same time is enabled. Moreover, by transmitting the differential data, the S/N ratio of the data is improved on the input side, so that high-speed sensing of the data is enabled. At the same time, by the data amplitude being small on the output side, the clock frequency can be increased without the slew rate in the output stage being improved. The input circuit and the output circuit sense and latch data with clocks of different phases generated from one clock. This enables elimination of the timing shift between the data and the clock due to a delay on the transmission line. According to the present invention, the data and the clock are synchronized with each other in an optimum phase at the input circuit and the output circuit.

Next, a case where the semiconductor memory card structured as described above is connected to the host apparatus will be described with reference to FIG. 3.

FIG. 3 shows a condition where the semiconductor memory card 1 is connected by being inserted in a card connector of the host apparatus 15. FIG. 3 shows the connection condition of only the signal lines. The host apparatus 15 and the semiconductor memory card 1 perform synchronous data transmission according to a master/slave method with the host apparatus 15 as the master and the semiconductor memory card 1 as the slave. The host apparatus 15 comprises: an interface control circuit 16; terminals 1 to 9; an output buffer 17; output impedance adjusting circuits 18, 21 and 22; a timing adjusting circuit 19, a differential output buffer 20; a band pass filter 23; an input buffer 24; and a differential input buffer 25. The structure of the output impedance adjusting circuits 18, 21 and 22 is the same as that of the output impedance adjusting circuits 12, 13 and 14. The structure of the timing adjusting circuit 19 is the same as that of the timing adjusting circuit 10. The structure of the band pass filter 23 is the same as that of the band pass filter 6.

The clock generated by the interface control circuit 16 is supplied, as the input clock CLKIN, to the terminal 1 through the output buffer 17 and the output impedance adjusting circuit 18. The clock generated by the interface control circuit 16 is input to the timing adjusting circuit 19 at the same time.

The timing adjusting circuit 19 receives the clock generated by the interface control circuit 16, delays the clock (adjusts the timing of the clock) so that the relative phases of the data and the clock are optimum on the receiving side, and outputs the timing-adjusted clock signal to the differential output buffer 20.

The interface control circuit 16 outputs output data on the falling edge (or the rising edge) of the clock that the circuit 16 itself generates. The differential output buffer 20 receives the output data, latches the output data on the rising edge of the clock output by the timing adjusting circuit 19, and outputs a complementary data pair (differential data). The differential output buffer 20 supplies the differential data, as differential input data DI+ and DI-, to the terminals 2 and 9 through the output impedance adjusting circuits 21 and 22.

The output clock CLKOUT output from the semiconductor memory card 1 to the terminal 5 is input to the interface control circuit 16 and the differential input buffer 25 through the band pass filter 23 and the input buffer 24.

The differential output data DO+ and DO- output from the semiconductor memory card 1 to the terminals 7 and 8 are input to the differential input buffer 25. The differential input buffer 25 senses, latches and outputs the output data DO which is the difference between the differential output data DO+ and DO- on the rising edge of the clock output by the input buffer 24. The interface control circuit 16 latches and receives the output data DO on the falling edge (or the rising edge) of the clock output by the input buffer 24.

As is apparent from FIG. 3, in the embodiment, only the host apparatus 15 has a clock generating source. The semiconductor memory card 1 synchronizes this one clock with the differential output data of the semiconductor memory card 1 by delaying the clock (adjusting the timing) by the timing adjusting circuit 10 so that the clock and the differential output data are in an optimum phase relationship on the receiving side, and outputs it as the output clock CLKOUT.

FIG. 4 will be described showing the waveforms of input and output signals of the semiconductor memory card 1 according to the first embodiment and the timing relationship there among. In FIG. 4, the reference designations of the waveforms are the same as those shown in FIG. 1. As the waveforms of input signals, the waveforms of the input clock CLKIN, the clock CLK, the differential input data DI+ and DI- and the input data DI are shown. As the waveforms of output signals, the waveforms of the output data DO, the clock CLK, the differential output data DO+ and DI, the timing-adjusted clock signal Delayed CLK and the output clock CLKOUT are shown.

The purpose of the adjustment by the timing adjusting circuits 10 and 19 will be described with reference to the timing chart of FIG. 4. When the delay times of the clock and the data are different from each other on the transmission line, on the receiving side, the phase of the clock is shifted from the appropriate timing where the differential data is sensed and latched, so that the data cannot be correctly sensed or latched on the receiving side. In particular, when the clock frequency is increased and the data transmission cycle time is decreased, there is a possibility that the latch clock is input at a timing where the potential difference between the non-inverted signal and the inverted signal of the differential input data is not more than the sensing sensitivity. In such a case, the possibility is also high that a malfunction of data transmission occurs.

Therefore, in order that the timing between the input data DI+ and DI- and the clock signal CLKIN is optimum in the semiconductor memory card 1, the host apparatus 15 adjusts the output timing of the input data DI+ and DI- so that the differential input data DI+ and DI- and the clock signal CLKIN are synchronized with each other in an appropriate phase relationship on the receiving side (the semiconductor memory card 1). This enables the semiconductor memory card 1 to appropriately perform sensing and latching of the differential input data DI+ and DI-. That is, the host apparatus 15 supplies the input data DI+ and DI- at a timing where the semiconductor memory card 1 can latch the differential input data DI+ and DI- in a condition where the potential difference between the data DI+ and DI- is not less than the sensing sensitivity and sufficiently large.

Likewise, for the signal output from the semiconductor memory card 1, in order that the timing between the output data DO+ and DO- and the clock CLKOUT is optimum in the host apparatus 15, the semiconductor memory card 1 adjusts the timing of the clock CLKOUT so that the differential output data DO+ and DO- and the clock CLKOUT are synchronized with each other in an appropriate phase relationship on the receiving side (the host apparatus 15). This enables the host apparatus 15 to appropriately perform sensing and latching of the differential output data DO+ and DO-.

It is necessary that the timing adjustment amount be fixed or variable.

A structure where the delay circuit for timing adjustment is disposed on the transmitting side and a structure where the delay circuit is disposed on the receiving side can be considered. Moreover, a structure where the delay circuit for timing adjustment delays the data and a structure where the delay circuit delays the clock may be considered. In the system (comprising the host apparatus and the semiconductor memory card) of the embodiment, the timing adjustment is performed on the transmitting side so that the relative phases of the data and the clock are appropriate on the receiving side. The difference between the delay times of the data and the clock differs according to the structures of the host apparatus and the semiconductor memory card. Generally, the difference between the delay times of the data and the clock depends on the structure of the transmitting side. The structure of the embodiment enables the receiving side to appropriately sense and latch the data by using the input clock without adjusting the timing between the data and the clock. Consequently, compatibility can be ensured when various kinds of host apparatuses and semiconductor memory cards are arbitrarily combined.

The clock output by the host apparatus is transmitted to the semiconductor memory card without passing through any delay circuit. The clock transmitted from the host apparatus and the semiconductor memory card acts as a reference phase in the transmission system design. For the data and the clock transmitted from the host apparatus to the semiconductor memory card, the host apparatus makes the relative phases of the data and the clock appropriate on the receiving side (the semiconductor memory card) by synchronizing the data and the clock with each other by adjusting the output timing of the data.

The data output by the semiconductor memory card is transmitted to the host apparatus without passing through any delay circuit. For the data and the clock transmitted from the semiconductor memory card to the host apparatus, the semiconductor memory card synchronizes the clock and the data with each other so that the relative phases of the clock and the data are appropriate on the receiving side (the host apparatus), by adjusting the output timing of the clock. In particular, in a semiconductor memory card according to a second embodiment supporting the prior art first and second operation modes and the operation mode (third operation mode) of the present invention, by the semiconductor memory card adjusting the output timing of not the data but the clock, the number of parts of the circuits switched in accordance with the operation mode can be reduced.

<<Embodiment 2>>

Figure 6:
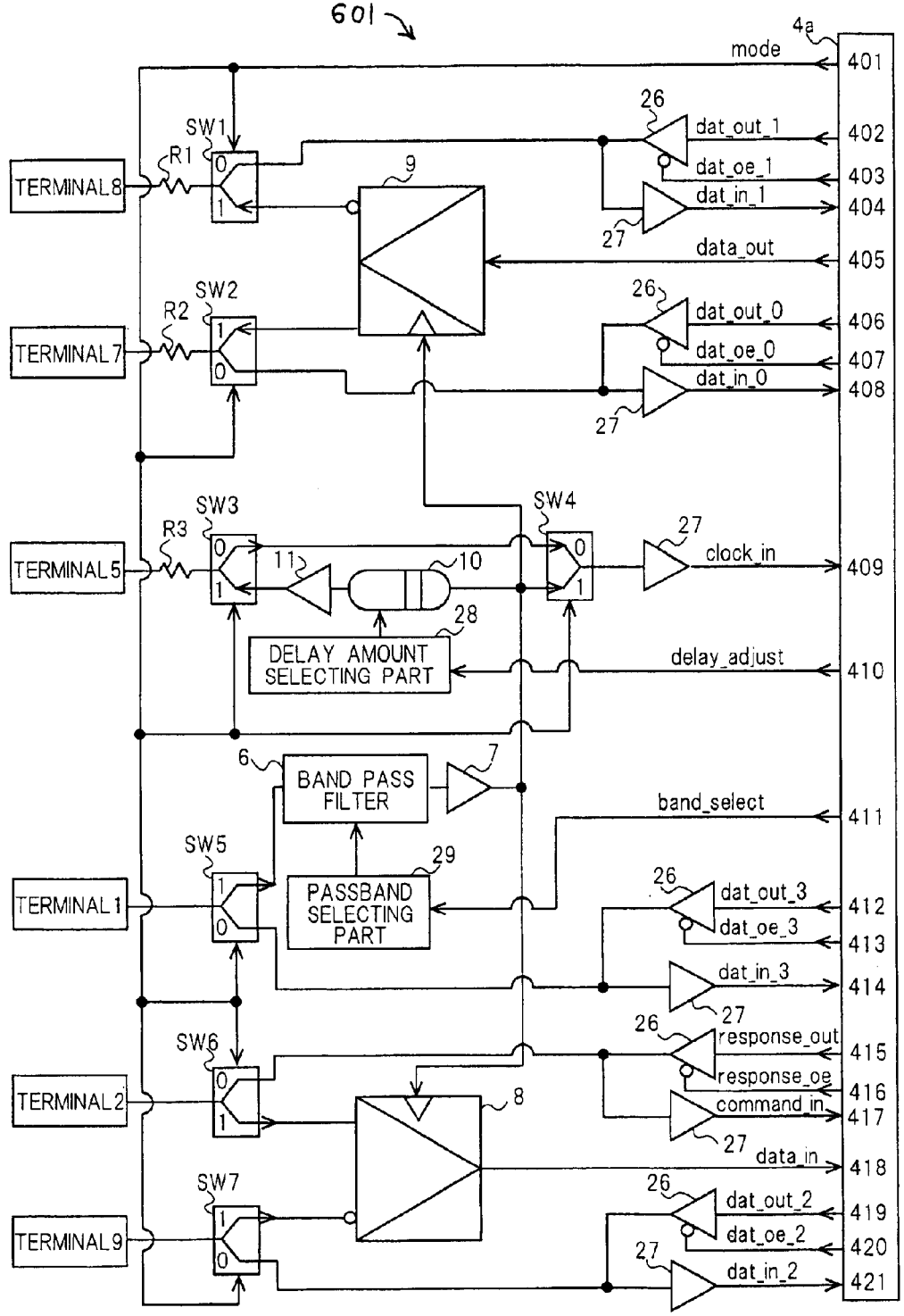
FIG. 6 is a concrete circuit diagram of the semiconductor memory card according to the second embodiment of the present invention.
Figure 7:
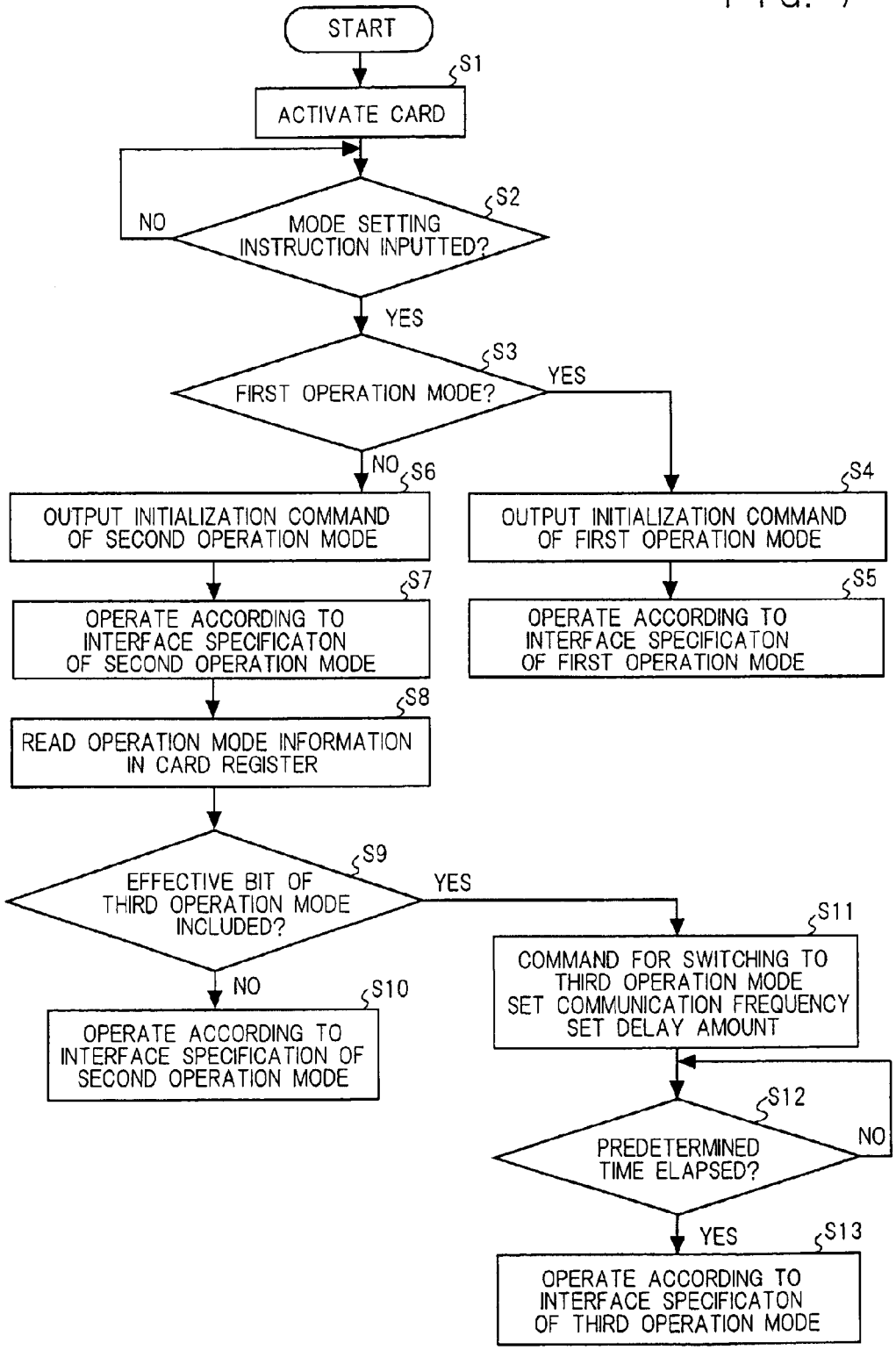
FIG. 7 is a flowchart of selection of the operation mode of the semiconductor memory card according to the second embodiment of the present invention.
Figure 8:
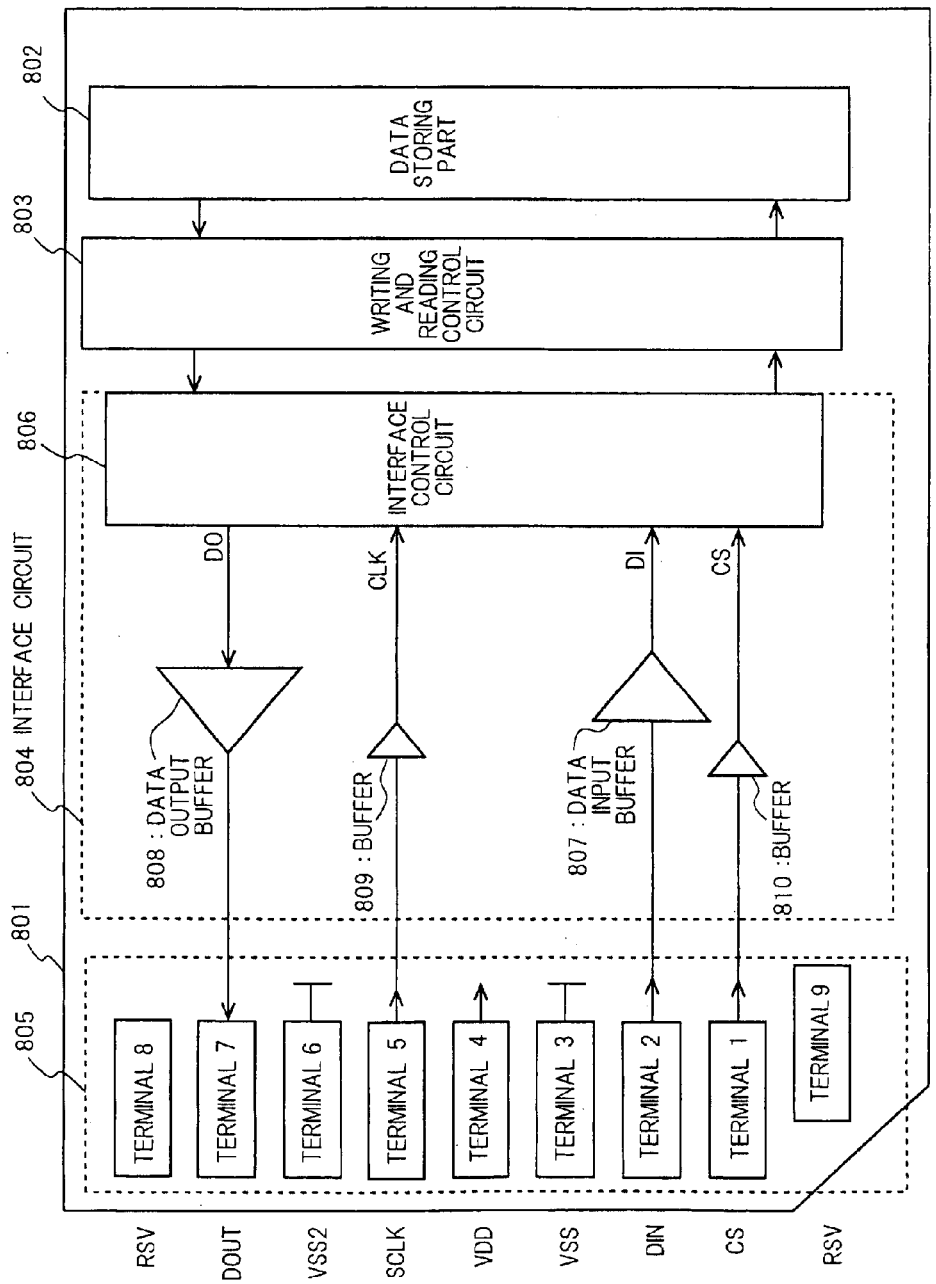
FIG. 8 is a block diagram of the prior art semiconductor memory card (including an internal block diagram of the interface circuit of the semiconductor memory card)
Figure 12:
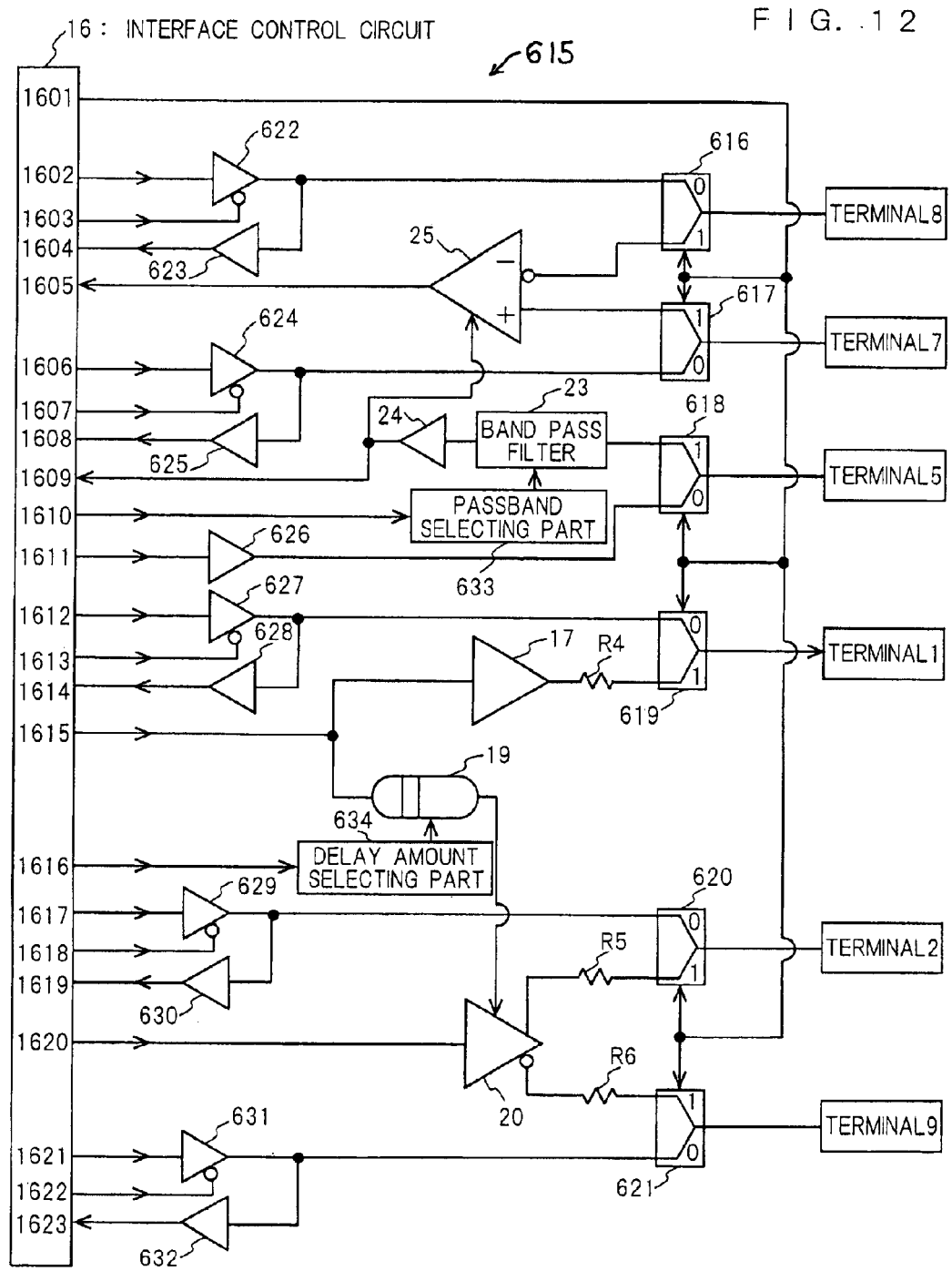
FIG. 12 is a concrete circuit diagram of a host apparatus 615 according to the second embodiment of the present invention.

The semiconductor memory card 601 and a host apparatus 615 according to the second embodiment of the present invention will be described with reference to FIG. 5 to FIG. 7 and FIG. 12. The semiconductor memory card 601 according to the second embodiment has an interface circuit capable of operating with the operation mode switched among the high-speed operation mode shown in the first embodiment and the prior art first and second operation modes. FIG. 5 is an explanatory view showing the attributes and the functions of the terminals of the semiconductor memory card 601 in each operation mode. FIG. 6 is a concrete circuit diagram of the semiconductor memory card 601 switchable according to which of a plurality of operation modes is set. FIG. 7 is a flowchart of selection of the operation mode of the semiconductor memory card 601 according to the second embodiment. The host apparatus 615 according to the second embodiment to which the semiconductor memory card 601 is attached operates in the first to the third operation modes by switching the internal connection. FIG. 12 is a concrete circuit diagram of the host apparatus 615 according to the second embodiment of the present invention whose operation is switchable according to which of the first to the third operation modes is set.

As shown in FIG. 5, in the semiconductor memory card 601, switching can be made among the card interface specifications (the normal operation mode) of the prior art two operation modes (the first and the second operation modes) shown in FIG. 9 and the interface specification (the high-speed operation mode, the third operation mode) of the first embodiment. The attributes and the functions of the terminals 1 to 9 in the third operation mode in FIG. 5 are the same as those of the terminals 1 to 9 of the first embodiment. In other words, in the semiconductor memory card 601, when the third operation mode is selected, similar advantages to those of the semiconductor memory card 1 of the first embodiment are obtained.

The semiconductor memory card 601 according to the second embodiment has the circuit structure of FIG. 6, and the attributes and the functions of the terminals are switched according to which of the operation modes of FIG. 5 is set. The host apparatus 615 according to the second embodiment has the circuit structure of FIG. 12, and the attributes and the functions of the terminals are switched according to which of the operation modes of FIG. 5 is set. FIG. 6 shows input and output circuits between the terminals 1, 2, 5 and 7 to 9 and the interface control circuit 4a. FIG. 12 shows input and output circuits of the terminals 1, 2, 5 and 7 to 9. The attributes and the functions of the terminals 3, 4 and 6 acting as power supply terminals do not change irrespective of which of the first to the third operation modes is set. In FIG. 6 and FIG. 12, the terminals 3, 4 and 6 are not shown.

In FIG. 6 and FIG. 12, elements the same as those of the first embodiment are designated by the same reference numerals. The interface control circuit 4a has input and output terminal parts 401 to 421 to and from which signals are input and output from and to circuit elements. In FIG. 6, reference numeral 26 represents a three-state output buffer, and reference numeral 27 represents an input buffer. A delay amount selecting part 28 selects and decides the timing delay amount of the timing adjusting circuit 10. A passband selecting part 29 selects and decides the passband of the band pass filter 6. The semiconductor memory card 601 has switching circuits SW1 to SW7, and switches the condition of connection between the terminals 1 to 9 and the interface control circuit 4a by controlling the switching circuits. By doing this, the semiconductor memory card 601 switches among the conditions of the first, the second and the third operation modes. Resistors R1, R2 and R3 constitute the above-mentioned output impedance adjusting circuits 14, 13 and 12, respectively.

The interface control circuit 4a writes the selected value of the delay time into an internal register in accordance with the clock frequency. The interface control circuit 4a outputs from the terminal part 410 an output signal DELAY_ADJUST read from the internal register, and writes it into the delay amount selecting part 28. The timing adjusting circuit 10 delays the clock by a delay time corresponding to the value of the output signal DELAY_ADJUST output by the delay amount selecting part 28 (the third operation mode).

The interface control circuit 4a writes the median value of the passband and the selected value of the bandwidth of the band pass filter 6 into the internal register in accordance with the clock frequency. The interface control circuit 4a outputs from the terminal part 411 an output signal BAND_SELECT read from the internal register, and writes it into the passband selecting part 29. The band pass filter 6 allows the clock input from the terminal 1 to pass therethrough with the median value of the frequency and the bandwidth corresponding to the output signal BAND_SELECT output from the passband selecting part 29 (the third operation mode).

The switching circuits SW1 to SW7 are all switched to the side of 1 or 0 in accordance with whether the value of the control signal is 1 or 0. By the switching circuits SW1 to SW7 being switched to the side of 1, the circuit structure becomes the one shown in FIG. 1. That is, the operation mode is switched to the third operation mode for high-speed data transmission. By the switching circuits SW1 to SW7 being switched to the side of 0, the semiconductor memory card 1 operates in the first or the second operation mode. In the second operation mode, the three-state output buffer 26 connected to the terminals 1, 2, 8 and 9 is set in a high-impedance condition, and in the first operation mode, the three-state output buffer 26 connected to the terminals 1, 2, 8 and 9 is switched between an output condition and the high-impedance condition. A mode switching signal MODE output by the output terminal part 401 controls the switching of the switching circuits SW1 to SW7.

When the semiconductor memory card 601 is attached to the host apparatus 615 or when power supply is started with the semiconductor memory card 601 attached to the host apparatus 615 (when the semiconductor memory card 601 is activated), the semiconductor memory card 601 initializes the mode switching signal MODE to 0 (the first operation mode). When the semiconductor memory card 601 is activated, the host apparatus 615 inputs to the semiconductor memory card 601 command data for setting the operation mode of the semiconductor memory card 601. The interface control circuit 4a sets the operation mode selected in accordance with the command data to a mode setting part of an internal first resister. The mode switching signal MODE corresponding to the set operation mode is output from the output terminal part 401. For example, when the set operation mode is the third operation mode, the switching circuits SW1 to SW7 initialized to the side of 0 are switched to the side of 1 in accordance with the command data from the host apparatus 615. Input and output of the output terminal part 405, the input terminal part 409 and the input terminal part 418 of the input and output terminals 401 to 421 of the interface control circuit 4a effectively work.

Under a condition where the switching circuits SW1 to SW7 are switched to the side of 0, the semiconductor memory card 601 according to the second embodiment operates as follows: The terminal parts 402 to 404 of the interface control circuit 4a performs data input and output through the terminal 8. The terminal part 403 outputs to the three-state output buffer 26 a control signal to permit or inhibit output. When an input data that is input from the terminal 8 through the input buffer 27 is present, the three-state output buffer 26 is inhibited from outputting data. This prevents a collision between the data output by the three-state output buffer 26 and the input data. Likewise, the input and output terminal parts 406 to 408 perform data input and output through the terminal 7. The input and output terminal parts 419 to 421 perform data input and output through the terminal 9. The input and output terminal parts 412 to 414 perform data input and output through the terminal 1. The input and output terminal parts 415 to 417 perform command input and response input through the terminal 2.

In FIG. 12, the host apparatus 615 comprises: switching circuits 616 to 621; three-state output buffers 622, 624, 627, 629 and 631; buffers 17, 24, 623, 625, 626, 628, 630 and 632; a band pass filter 23; a timing adjusting circuit 19; a passband selecting part 633; a delay amount selecting part 634; and resistors R4 to R6. The host apparatus 615 and the semiconductor memory card 601 perform synchronous data transmission according to a master/slave method with the host apparatus 615 as the master and the semiconductor memory card 601 as the slave. The switching circuits 616 to 621 are switched to the side of 1 or 0 in accordance with whether the value of the control signal output from a terminal part 1601 of the interface control circuit 16 is 1 or 0. In the first and the second operation modes, the switching circuits 616 to 621 are switched to the side of 0. In the third operation mode, the switching circuits 616 to 621 are switched to the side of 1. In the third operation mode, the circuit structure and the operation of the host apparatus 615 are the same of those of the host apparatus of the first embodiment. The resistors R4, R5 and R6 are implementation of the output impedance adjusting circuits 18, 21 and 22 of FIG. 3. The passband selecting part 633 decides the median value of the frequency and the bandwidth of the band pass filter 23 in accordance with the output signal output from a terminal part 1610 of the interface control circuit 16. The delay amount selecting part 634 decides the delay time of the clock at the timing adjusting circuit 19 in accordance with the output signal output from a terminal part 1616 of the interface control circuit 16. In the first operation mode, the three-state buffer 624 and the buffer 625 bidirectionally transmit and receive data through the terminal 7. In the second operation mode, the three-state buffer 624 is set in a high-impedance condition. The host apparatus 615 receives data through the terminal 7. In the first and the second operation modes, the other pairs of three-state buffers and buffers bidirectionally transmit and receive data, output data or do not operate according to the specification of FIG. 5.

Next, a method of selecting a mode among the three operation modes in the semiconductor memory card 601 will be described with reference to the flow chart shown in FIG. 7. FIG. 7 shows the procedure by which the host apparatus 615 initializes the semiconductor memory card 601. In the initial condition (when the semiconductor memory card 601 is activated), the semiconductor memory card 601 is set so as to operate in the first operation mode.

First, the host apparatus 615 supplies power to the semiconductor memory card 601 (step S1). The host apparatus 615 and the semiconductor memory card 601 are initialized to the first operation mode. At step S2, a microcomputer provided in the host apparatus 615 waits for input of an operation mode setting instruction (step S2). When an operation mode setting instruction is input, the process proceeds to step S3, and when no operation mode setting instruction is input, step S2 is repeated. When an operation mode setting instruction is input, it is determined whether the set operation mode is the first operation mode or not (step S3). When the set operation mode is the first operation mode, the process proceeds to step S4, and when the set operation mode is not the first operation mode, the process proceeds to step S6.

At step S4, the card interface control circuit 16 of the host apparatus 615 outputs an initialization command of the first operation mode to the semiconductor memory card 601. The host apparatus 615 and the semiconductor memory card 601 operate according to the interface specification of the first operation mode (step S5).

At step S6, the card interface control circuit 16 of the host apparatus 615 outputs an initialization command of the second operation mode to the semiconductor memory card 601. The host apparatus 615 and the semiconductor memory card 601 operate according to the interface specification of the second operation mode (step S7). At step S8, the card interface control circuit 16 reads operation mode information set in a register in the semiconductor memory card 601. At step S9, the card interface control circuit 16 determines whether the read operation mode information includes an effective bit of the third operation mode or not. When an effective bit of the third operation mode is not included, the process proceeds to step S10, and the host apparatus 615 and the semiconductor memory card 601 continue to operate according to the interface specification of the second operation mode.

When it is determined at step S9 that an effective bit of the third operation mode is included, the process proceeds to step S11. The card interface control circuit 16 of the host apparatus 615 outputs to the semiconductor memory card 601 a command for switching to the third operation mode. The card interface control circuit 16 instructs the passband selecting part 633 to set the median value of the frequency and the band width of the band pass filter 23 to values suitable for the third operation mode, and instructs the delay amount selecting part 634 to set the delay time of the clock at the timing adjusting circuit 19 to a value suitable for the third operation mode (step S11).

Then, at step S12, the process waits until a predetermined time elapses. The predetermined time is set to a time sufficient for the semiconductor memory card 601 having received the command for switching to the third operation mode, to perform internal setting according to the third operation mode. After the predetermined time has elapsed, the host apparatus 615 and the semiconductor memory card 601 operate according to the interface specification of the third operation mode (step S13).

As described above, according to the present invention, input data and output data never collide on the data line, and this enables high-speed data communication control. Moreover, by adopting differential data input and output circuits (complementary data transmission), the S/N ratio of the reception data is improved. This enables the receiving side to sense the reception data at high speed. The improvement of the S/N ratio enables the amplitude of the transmission data to be small on the transmitting side. By the data amplitude being small, the clock frequency can be increased without the slew rate in the output stage being improved. Complementary data transmission was adopted only in asynchronous data communication in prior arts, and the idea of adopting complementary data transmission in synchronous data transmission was absent.

In the present invention, an input clock and an output clock having different phases are separately generated, and the data and the clock are transmitted in synchronism with each other so that the clock and the data have optimum relative phases on the receiving side. According to the present invention, an advantageous effect is obtained that the timing shift between the data and the clock due to a delay on the transmission line is never caused. In synchronous data communication according to the prior art master/slave method, the clock was transmitted only from the master apparatus (host apparatus) to the slave apparatus (semiconductor memory card), and the idea of transmitting another clock from the slave apparatus to the master apparatus was absent.

The semiconductor memory card timing-adjusts the input clock output by the host apparatus, and transmits the timing-adjusted clock and the data in synchronism with each other so that they are in an optimum phase relationship on the receiving side (host apparatus). According to the present invention, an effect is obtained that a semiconductor memory card not requiring a clock generating part is realized. In synchronous data communication according to the master/slave method, it is difficult for the master apparatus to appropriately control the entire communication unless the master apparatus outputs a clock. In the prior art, the master apparatus input, by using the lock which the master apparatus itself outputs, the data that the slave apparatus output by using the clock which the master apparatus output and the slave apparatus received. However, since the signal transmission path of the data transmitted from the slave apparatus (the clock with which data has been transmitted goes and the data returns between the master apparatus and the slave apparatus) and that of the clock generated by the master apparatus are completely different from each other, the phase relationship therebetween is shifted at a particularly high data rate. Although it is unnecessary to transmit and receive a clock in asynchronous data transmission in which no clock is transmitted, generally speaking, the data rate is lower in asynchronous data transmission than in synchronous data transmission. The present invention relates to an apparatus and a method for performing synchronous data communication according to the master/slave method in which only the master apparatus (host apparatus) generates a clock. The master apparatus transmits a clock for data transmission from the master apparatus to the slave apparatus (semiconductor memory card). The slave apparatus uses the clock or a clock obtained by delaying the clock as a clock for data transmission from the slave apparatus to the master apparatus, and transmits the clock to the master apparatus together with the data. In the data transmission from the slave apparatus to the master apparatus, a large phase shift is not caused because the data and the clock are transmitted substantially on the same path. By the timing adjusting circuit of the slave apparatus adjusting the phase of the clock, the data and the clock are in an appropriate phase relationship in the master apparatus on the receiving side. The present invention realizes a slave apparatus (semiconductor memory card) performing high-data-rate and stable data transmission according to the master/slave method under a condition where the master apparatus (host apparatus) maintains a function to appropriately control the entire communication.

<<Embodiment 3>>

The interface apparatus for the semiconductor memory card according to the third embodiment of the present invention (hereinafter, will be referred to as "interface apparatus") will be described with reference to FIG. 13. FIG. 13 is a block diagram of a system having a host apparatus 615, an interface apparatus 1301 according to the third embodiment and a semiconductor memory card 1302 according to the third embodiment.

In FIG. 13, the host apparatus 615 is the same as the host apparatus according to the second embodiment.

The interface apparatus 1301 has a connection terminal to the host apparatus 615 and the interface circuit (FIG. 6) which are the same as those of the semiconductor memory card 601 according to the second embodiment. The interface apparatus 1301 is an interface adaptor having approximately the same external shape with that of the semiconductor memory card 601 according to the second embodiment. The semiconductor memory card 1302 is smaller in size than the semiconductor memory card 601 according to the second embodiment and has no interface circuit. The interface apparatus 1301 has terminals for connecting to the semiconductor memory card 1302 and an attachment device for the semiconductor memory card 1302.

The interface apparatus 1301 carrying the semiconductor memory card 1302 is capable of being attached to the host apparatus 615 (the second embodiment) to which the semiconductor memory card 601 of the second embodiment can be attached. The interface apparatus 1301 carrying the semiconductor memory card 1302 has mechanical and electrical compatibility with the semiconductor memory card 601 according to the second embodiment.

The semiconductor memory card 1302 has the configuration of the semiconductor memory card 601 according to the second embodiment from which the interface circuit is subtracted. The semiconductor memory card 1302 has a data storing portion 2 and a writing and reading control circuit 3 which are the same as those of the semiconductor memory card 601 according to the second embodiment.

The system according to the third embodiment having the host apparatus 615, the interface apparatus 1301 and the semiconductor memory card 1302 performs the same operation and has the same effect as those of the system according to the second embodiment having the host apparatus 615 and the semiconductor memory card 601.

The interface apparatus according to the third embodiment had the interface circuit of the semiconductor memory card 601 according to the second embodiment. In place of this, the interface apparatus for the semiconductor memory card may have the interface circuit of the semiconductor memory card 1 according to the first embodiment. This interface apparatus is capable of operating by attaching and connecting to the host apparatus according to the first embodiment.

The host apparatus, the semiconductor memory card and the interface apparatus for semiconductor memory card according to the present invention are adaptable to the interface specifications of a plurality of operation modes, and particularly, are adaptable to the high-speed operation mode without the number of connection terminals being increased. The host apparatus, the semiconductor memory card and the interface apparatus for semiconductor memory card according to the present invention execute the control method of performing communication according to the interface specification of the present invention by a procedure through operation modes of the prior art semiconductor memory card. Consequently, the terminal structure of the semiconductor memory card according to the present invention maintains compatibility with that of the prior art semiconductor memory card, and a high data transfer rate can be realized between the semiconductor memory card and the host apparatus according to the present invention.

The host apparatus, the semiconductor memory card and the interface apparatus for semiconductor memory card according to the present invention are adaptable to the interface specifications of a plurality of operation modes by switching the switches according to which of the operation modes is set, and particularly, are adaptable to the high-speed operation mode with a simple structure without the number of terminals being increased. Moreover, impedance matching with the signal lines can be obtained. By the band pass filter, a clock of a predetermined frequency band can be captured with reliability. By optimally setting the frequency of the band pass filter, a timing shift due to a reflected wave can be prevented.

Although the invention has been described in its preferred form with a certain degree of particularity, it is understood that the present disclosure of the preferred form has been changed in the details of construction and the combination and arrangement of parts may be resorted to without departing from the scope and the spirit of the invention as hereinafter claimed.

What is claimed is:

1. A semiconductor memory card comprising:
   a data storing part;
   a control part writing and reading data into and from said data storing part;
   an interface circuit; and
   a plurality of input and output terminals, wherein
   in said input and output terminals, roles of a data input terminal pair and a data output terminal pair are each allotted to a different terminal pair so that no terminal pair acts as both the data input terminal pair and the data output terminal pair, and a clock input terminal and a clock output terminal are included, and
   said interface circuit receives an input clock from said clock input terminal, receives a complementary input data pair synchronized with said input clock from said data input terminal pair, outputs a complementary output data pair from said data output terminal pair, and outputs an output clock synchronized with said complementary output data pair from said clock output terminal.

2. A semiconductor memory card in accordance with claim 1, wherein
   said semiconductor memory card performs data input and output with a host apparatus,
   said interface circuit receives an input clock output by said host apparatus and input data synchronized with said input clock, and
   said interface circuit generates said output clock having a phase different from a phase of said input clock and being synchronized with said complementary output data pair by adjusting a timing of said input clock, outputs said output clock from said clock output terminal, and outputs said complementary output data pair from said data output terminal pair.

3. A semiconductor memory card comprising:
   an interface circuit setting an attribute and a function of each of a plurality of input and output terminals and performing internal setting in accordance with an operation mode selected and set from among a plurality of operation modes including a high-speed operation mode; and
   said plurality of input and output terminals, wherein
   in said high-speed operation mode, said plurality of input and output terminals comprise:
   a clock input terminal to which an input clock is input;
   a clock output terminal from which an output clock is output;
   a data input terminal pair to which a complementary input data pair synchronized with said input clock is input; and
   a data output terminal pair from which a complementary output data pair is output, and
   said interface circuit comprises the following as elements operating at least in said high-speed operation mode:
   a switch capable of being switched in accordance with said high-speed operation mode;
   a differential input buffer receiving said complementary input data pair, sensing a difference between said complementary input data pair by said input clock, and latching said difference;
   a differential output buffer receiving output data and outputting said output data by said input clock as said complementary output data pair; and
   a timing adjusting circuit receiving said input clock, adjusting a timing of said input clock with said complementary output data pair, and outputting, as said output clock, said input clock timing-adjusted so as to be synchronized with said complementary output data pair.

4. A semiconductor memory card in accordance with claim 3, wherein said interface circuit has output impedance adjusting circuit(s) each of between said data output terminal pair and said differential output buffer and between said output clock terminal and said timing adjusting circuit.

5. A semiconductor memory card in accordance with claim 4, wherein
   said interface circuit further comprises a band pass filter receiving said input clock and allowing only a predetermined frequency band component to pass through said band pass filter.

6. A semiconductor memory card in accordance with claim 5, wherein a passband frequency of said band pass filter is selectable.

7. A semiconductor memory card in accordance with claim 3, wherein
   said interface circuit further comprises a band pass filter receiving said input clock and allowing only a predetermined frequency band component to pass through said band pass filter.

8. A semiconductor memory card in accordance with claim 7, wherein
   a passband frequency of said band pass filter is selectable.

9. A method of controlling, in a high-speed operation mode, a semiconductor memory card having a plurality of input and output terminals and performing data input and output with a host apparatus in a plurality of operation modes including a normal operation mode and said high-speed operation mode, said method comprising the steps of:

setting said high-speed operation mode in response to a setting command of said high-speed operation mode from said host apparatus;

switching an operation of said semiconductor memory card so that data transmission and reception can be performed in said high-speed operation mode;

allotting roles of a data input terminal pair, a data output terminal pair, a clock input terminal and a clock output terminal separately to said input and output terminals so that none of said input and output terminals has a plurality of roles;

inputting an input clock from said clock input terminal and inputting a complementary input data pair synchronized with said input clock from said data input terminal pair;

generating an output clock having a phase different from a phase of said input clock, by adjusting a timing of said input clock; and outputting said output clock from said clock output terminal and outputting a complementary output data pair synchronized with said output clock from said data output terminal pair.

10. A slave apparatus performing synchronous data transmission according to a master/slave method with a host apparatus as a master and a slave apparatus as a slave, said slave apparatus comprising:

an input part inputting a clock and data output by said host apparatus in synchronism with each other; and an output part outputting to said host apparatus said clock being input or a clock obtained by timing-adjusting said clock, and data in synchronism with each other.

11. A slave apparatus in accordance with claim 10, wherein said slave apparatus is a semiconductor memory card.

12. An interface apparatus for a semiconductor memory card comprising:

an interface circuit setting an attribute and a function of each of a plurality of input and output terminals and performing internal setting in accordance with an operation mode selected and set from among a plurality of operation modes including a high-speed operation mode; and said plurality of input and output terminals, wherein in said high-speed operation mode, said plurality of input and output terminals comprise:

a clock input terminal to which an input clock is input;

a clock output terminal from which an output clock is output;

a data input terminal pair to which a complementary input data pair synchronized with said input clock is input; and a data output terminal pair from which a complementary output data pair is output, and said interface circuit comprises the following as elements operating at least in said high-speed operation mode:

a switch capable of being switched in accordance with said high-speed operation mode;

a differential input buffer receiving said complementary input data pair, sensing a difference between said complementary input data pair by said input clock, and latching said difference;

a differential output buffer receiving output data and outputting said output data by said input clock as said complementary output data pair; and a timing adjusting circuit receiving said input clock, adjusting a timing of said input clock with said complementary output data pair, and outputting, as said output clock, said input clock timing-adjusted so as to be synchronized with said complementary output data pair.

* * * * *

UNITED STATES PATENT AND TRADEMARK OFFICE
CERTIFICATE OF CORRECTION

PATENT NO. : 6,842,395 B2
DATED : January 11, 2005
INVENTOR(S) : Hideki Kawai et al.

It is certified that error appears in the above-identified patent and that said Letters Patent is hereby corrected as shown below:

<u>Title page,</u>
Item [73], Assignee, should read -- Matsushita Electric Industrial Co., Ltd. --.

Signed and Sealed this

Twelfth Day of April, 2005

JON W. DUDAS
*Director of the United States Patent and Trademark Office*